United States Patent

[11] 3,588,554

[72] Inventors Petr Grigorievich Pozdnyakov
Otkrytoe shosse, 23. Kprpus 1, Kv. 26;
Valentina Georgievna Androsova,
Tovarischeskaya ulitsa, 23, Korpus 1, Kv. 63, Moscow, U.S.S.R.

[21] Appl. No. 798,710
[22] Filed Feb. 12, 1969
[45] Patented June 28, 1971

[54] PIEZOELECTRIC QUARTZ VIBRATOR
4 Claims, 8 Drawing Figs.

[52] U.S. Cl. .......... 310/9.5, 310/9.7
[51] Int. Cl. .......... H01v 7/00
[50] Field of Search .......... 310/9.1, 9.4, 9.5—9.8

[56] References Cited

UNITED STATES PATENTS

| | | | |
|---|---|---|---|
| 3,376,439 | 4/1968 | Vasin et al. | 310/9.5 |
| 3,437,851 | 4/1969 | Cady | 310/9.6 |
| 2,277,709 | 3/1942 | McSkimin et al. | 310/9.5 |
| 2,303,375 | 12/1942 | Mason | 310/9.5 |
| 2,484,635 | 10/1949 | Mason | 310/9.5 |

FOREIGN PATENTS

| | | | |
|---|---|---|---|
| 885,562 | 1/1954 | Germany | 310/9.5 |

OTHER REFERENCES

" Handbook of Piezoelectric Crystals for Radio Equipment Designers" , J. P. Buchanan, WADC Technical Report 54—248, 1954, (Office of Technical Services, U.S. Dept. of Commerce, Wash., D.C., PB-No. 111586)

*Primary Examiner*—D. F. Duggan
*Assistant Examiner*—B. A. Reynolds
*Attorney*—Waters, Roditi, Schwartz & Nissen

ABSTRACT: A piezoelectric quartz vibrator with a crystalline quartz element having the form of a bar of rectangular cross section so cut relative to the orthogonal axes of the quartz crystal that the length of the crystal line quartz element is disposed in the direction of the X-axis of the quartz crystal and the wider side surfaces are almost parallel to the side surface R of the major rhombohedron of the quartz crystal and form with other axes Y and Z of the quartz crystal angles approximating 45°. Electrodes of opposite polarity of the piezoelectric quartz vibrator are disposed on at least one pair of the opposite side surfaces of the crystalline element. The piezoelectric quartz vibrator has a low (zero) temperature coefficient of frequency which is controlled by changing the ratiòn of the thickness to the width of the crystalline quartz element at a constant value of its cut angle.

PIEZOELECTRIC QUARTZ VIBRATOR

The present invention relates to piezoelectric crystal units, and more specifically to piezoelectric crystal vibrator using quartz crystals for use in oscillators and electrical filters.

The prior art is replete with piezoelectric crystal units using piezoelectric crystal elements in the form of bars almost square in cross section, cut so that their length is in the direction of the X-axis of the original crystal, while the side surfaces make an angle of about 45° with the Y- and Z-axes of the original crystal.

Four electrodes are attached to the side surfaces with pairs of electrodes being formed on opposite surfaces having the same polarity. With these electrodes, the bar is caused to oscillate in the torsional mode of vibration. The frequency of the vibration depends on the length of the bar, and this frequency is relatively low, being anywhere from 30 to 150 kHz.

Higher frequencies can be achieved through the use of the overtones of this torsional mode of vibration which, however, complicates the fabrication of the piezoelectric crystal units. Furthermore, such piezoelectric crystal units have a high impedance, a low Q-factor, and an insufficient frequency stability with temperature.

An object of the present invention is to provide a piezoelectric quartz crystal vibrator for frequencies from 300 to 1,000 kHz., which has a low temperature coefficient of frequency, lower than that of conventional piezoelectric crystal vibrators used in the frequency range indicated.

Another object of the present invention is to provide a piezoelectric quartz crystal vibrator which has improved electrical characteristics, notably a high Q-factor.

Still another object of the invention is to provide a piezoelectric quartz crystal vibrator which permits adjustment of the zero point of the temperature coefficient of frequency within broad limits by varying the cross-sectional dimensions of the piezoelectric crystal element without changing the cut of the element relative to the crystallographic axes, so that the manufacture of piezoelectric crystal vibrators can be simplified and less expensive.

A further object of the present invention is to provide a piezoelectric quartz crystal vibrator which has a high intensity of vibration and a low impedance.

With these and other objects in view, a piezoelectric quartz crystal vibrator is provided which comprises a piezoelectric quartz crystal element with electrodes, in the form of a bar having a rectangular cross section, cut so that its length is in the direction of the X-axis of the original crystal, while its side surfaces make an angle of about 45° with the Y- and Z-axes of the original crystal, and electrodes of opposite polarity are attached, according to the invention, to at least one pair of opposite side surfaces of the bar so that the piezoelectric quartz crystal elements are caused to oscillate in the shear mode of vibration in the transverse direction.

In order to increase the intensity of vibrations and to reduce the impedance of the piezoelectric quartz crystal vibrator, electrodes of opposite polarity are attached to two pairs of opposite side surfaces of the bar and are connected in the zone of the side edges of the bar through which the Y-axis of the original crystal approximately passes.

The piezoelectric quartz crystal shear vibrator disclosed herein has a temperature coefficient of frequency which is lower by at least one-third than that of torsional vibrators, and has a lower impedance and a correspondingly greater Q-factor.

Other objects and advantages of the present invention will be clear from the following description of a preferred embodiment when read in connection with the accompanying drawings, in which.

Figures 1, 2, 3, 4, 5, 6:
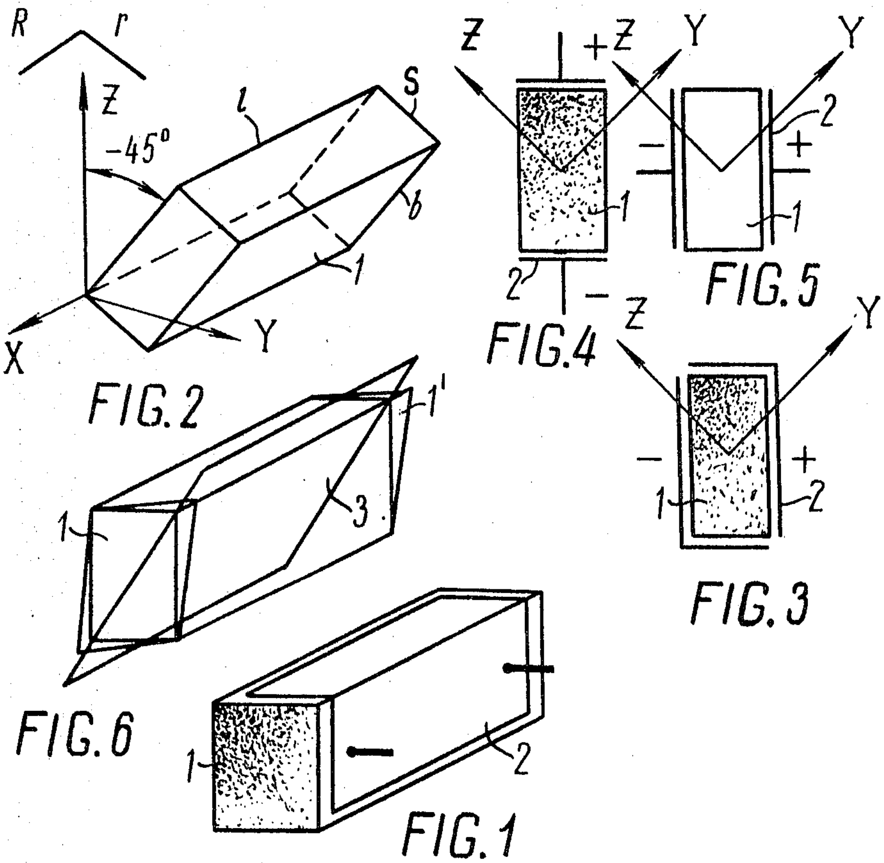
FIG. 1 shows an axonometric view of a piezoelectric quartz crystal vibrator according to the invention.
FIG. 2 shows an axonometric view of the piezoelectric quartz crystal element of the vibrator FIG. 1.
FIG. 3 shows a cross-sectional view through the piezoelectric quartz crystal vibrator of FIG. 1.
FIGS. 4 and 5 show cross-sectional views through two modifications of a piezoelectric quartz crystal vibrator according to the invention.
FIG. 6 shows shear strains in the bar of the piezoelectric quartz crystal elements disclosed herein.

Referring to FIG. 1, a piezoelectric quartz crystal vibrator is shown comprising a piezoelectric crystal element 1 which is a bar of nearly square cross section.

The bar 1 is cut so that its length is in the direction of the X-axis of the original crystal, as shown in FIG. 2, while its side surfaces make an angle of about 45° with the Y- and Z-axes of the original crystal. The letters R and $r$ in FIG. 2 denote the directions in which sections pass through the faces of the major and minor rhombohedra of the original crystal, and the letters I, $b$ and $s$ designate the length, width and thickness of the bar 1, respectively.

As seen from FIG. 2, the wider side surface of the crystalline quartz element is approximately parallel to the side surface R of the major rhombohedron of the quartz crystal.

A low temperature coefficient of frequency is obtained when a major flat surface of the bar makes an angle of 45° with the Z-axis of the crystal, as shown in FIG. 2, while the thickness-to-width ratio, $s/b$, is anywhere from 0.6 to 1.0.

In order to secure a low impedance and a high vibration intensity, the electrodes 2 (FIGS. 1 and 3) of opposite polarity are attached to two pairs of opposite side surfaces of the bar 1 and are connected in the zone of the side edges of the bar 1, through which the Y-axis of the crystal approximately passes.

If the high intensity of vibrations is not essential, electrodes 2 of opposite polarity may be attached only to one pair of opposite side surfaces of the bar 1, as shown in FIGS. 4 and 5.

The operating principle of the piezoelectric quartz crystal vibrator disclosed herein is as follows.

The voltage applied to the electrodes 2 of opposite polarity produces in the bar 1 shear strains in the plane 3 (FIG. 6) inclined toward the side surfaces of the bar 1. The position of the strained bar, denoted by the numeral 1′, is shown in FIG. 6.

The alternating voltage applied to the bar 1 causes it to oscillate in two shear modes of vibration whose frequencies are determined by the width $b$ and the thickness $s$ of the bar, respectively. The frequency coefficients of these vibrations are different and are respectively equal to 1,700 and 2,500 kHz./mm. The temperature coefficients of frequency of both vibration modes may be varied within broad limits by varying the relative magnitudes of $s$ and $b$.

Figure 7:
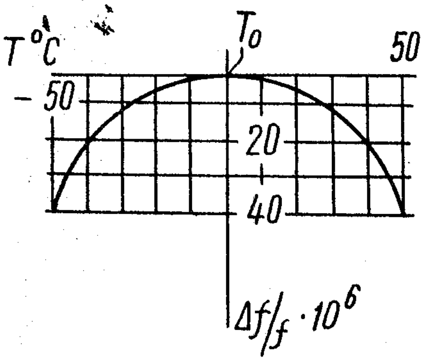
FIG. 7 is a graph relating the frequency of the piezoelectric quartz crystal vibrator to temperature.

As has already been noted, the minimum temperature coefficient of frequency for both modes of vibration occurs when the ratio $s/b$ is anywhere between 0.6 and 1.0. The frequency vs. temperature characteristic of the piezoelectric quartz crystal vibrator disclosed herein has the form of a quadratic parabola shown in FIG. 7, where frequency change in parts per million ($\Delta f/f \times 10^6$) is located on the ordinate, and temperature in degrees Centigrade (T°C) is located on the abscissa. For the low frequency mode of vibration, the slope of the frequency vs. temperature curve is $C=0.015\times^{16}$ per degree Centigrade squared, while for the high frequency mode of vibration the slope of the frequency vs. temperature curve is $C=(0.025 \text{ to } 0.030)\times10^{16}$ per degree Centigrade squared.

Figure 8:
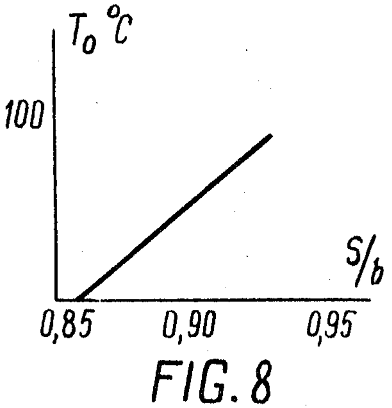
FIG. 8 is a graph showing the position of the peak of the frequency vs. temperature curve of FIG. 7 as a function of the thickness-to-width ratio of the bar used in the piezoelectric quartz crystal vibrator disclosed herein.

The graph in FIG. 8 relates the position of the temperature point ($T_o$ in FIG. 7) corresponding to the zero temperature coefficient of frequency as a function of the relative magnitudes of $s$ and $b$ of the bar 1 for the low frequency mode of vibration. In this plot the ratio $s/b$ is located on the abscissa, and the temperature ($T_o$°C) is located on the ordinate.

The piezoelectric quartz crystal vibrator disclosed herein has a low impedance, because the dynamic resistance lies anywhere between a few ohsm to a few tens of ohsm, and the dynamic inductances ranges from 2 to 12 henries.

While the present invention has been described in connection with a preferred embodiment, it is not, and should not be, limited to the details shown, since there may be modifications and adaptations without any departure from the idea and scope of the invention, which those skilled in the art will readily understand.

Such modifications and adaptations are and should be considered to be within the range of equivalence of the present invention as set forth in the accompanying claims.

We claim:

1. A piezoelectric quartz crystal vibrator comprising: a crystalline element having the form of a bar of rectangular cross section cut so that its length coincides with the direction of the X-axis of the quartz crystal with the wider side surfaces being almost parallel to the side surface of the major rhombohedron of the quartz crystal and forming with the other orthogonal axes Y and Z of the quartz crystal angles approximating 45°; electrodes of opposite polarity disposed at least on one pair of the opposite side surfaces of said crystalline quartz element so that oscillations in the shear mode are produced in a direction transverse to the length of said crystalline quartz element.

2. A piezoelectric quartz vibrator as set forth in claim 1 wherein said electrodes of opposite polarity are disposed on two pairs of opposite side surfaces of said crystalline quartz element and are connected in the zone of side edges through which the Y-axis of the crystal approximately passes.

3. A piezoelectric quartz vibrator as set forth in claim 1 wherein the frequency vs. temperature characteristic of said vibrator is in the form of a quadratic parabola.

4. A piezoelectric quartz vibrator as set forth in claim 3 wherein the ratio of the width to the thickness of said bar is between 0.6 and 1.0.